United States Patent
Lee et al.

[11] Patent Number: 5,922,622
[45] Date of Patent: *Jul. 13, 1999

[54] PATTERN FORMATION OF SILICON NITRIDE

[75] Inventors: Ching-Ying Lee, Hsin-Chu; Kuo-Chang Wu, Taichung, both of Taiwan

[73] Assignee: Vanguard International Semiconductor Corporation, Hsin-Chu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 08/706,873

[22] Filed: Sep. 3, 1996

[51] Int. Cl.[6] .................................................. H01L 21/302
[52] U.S. Cl. ........................ 438/734; 438/743; 438/744
[58] Field of Search ................................... 438/736, 744, 438/734, 743

[56] References Cited

U.S. PATENT DOCUMENTS

| | | | |
|---|---|---|---|
| Re. 30,505 | 2/1981 | Jacob | 156/643 |
| 4,180,432 | 12/1979 | Clark | 156/643 |
| 4,484,979 | 11/1984 | Stocker | 438/724 |
| 4,978,420 | 12/1990 | Bach | 438/724 |
| 5,700,739 | 12/1997 | Chiang et al. | 438/751 |

FOREIGN PATENT DOCUMENTS

| | | |
|---|---|---|
| 5-160077 | 6/1993 | Japan . |
| 5-21795 | 8/1993 | Japan . |
| 5-217954 | 8/1993 | Japan . |

OTHER PUBLICATIONS

S. Wolf et al., "Silicon Processing For The VLSI Era" vol. 1 Lattice Press. Sunset Beach, CA, p. 581, 1986.

Primary Examiner—Maria Nuzzolillo
Assistant Examiner—Laura Weiner
Attorney, Agent, or Firm—George O. Saile; Stephen B. Ackerman; Alek P. Szecsy

[57] ABSTRACT

A plasma etch method for forming a patterned silicon nitride layer within an integrated circuit. There is first provided a substrate having formed thereover a blanket silicon nitride layer. There is then formed upon the blanket silicon nitride layer a patterned photoresist layer. Finally, there is etched through a plasma etch method while employing the patterned photoresist layer as an etch mask layer the blanket silicon nitride layer to form a patterned silicon nitride layer. The plasma etch method employs an etchant gas composition comprising a perfluorocarbon etchant gas, a hydrofluorocarbon etchant gas and an oxygen etchant gas at a perfluorocarbon etchant gas flow rate, a hydrofluorocarbon etchant gas flow rate and an oxygen etchant gas flow rate which yields substantially no plasma etch bias of the patterned silicon nitride layer with respect to the patterned photoresist layer. When the patterned silicon nitride layer is employed within a thermal oxidation mask, the blanket silicon nitride layer is only nearly completely patterned through the plasma etch method. The nearly completely patterned silicon nitride layer is then completely patterned and over-etched through a second plasma etch method, where the second plasma etch method employs a second etchant gas composition comprising a perfluorocarbon etchant gas, a hydrofluorocarbon etchant gas and an oxygen etchant gas at a perfluorocarbon etchant gas flow rate, a hydrofluorocarbon etchant gas flow rate and an oxygen etchant gas flow rate which minimizes etching of a blanket silicon oxide layer formed beneath the patterned silicon nitride layer within the thermal oxidation mask.

10 Claims, 2 Drawing Sheets

PATTERN FORMATION OF SILICON NITRIDE

BACKGROUND OF THE INVENTION

1. Field of the Invention

The present invention relates to plasma etch methods for forming patterned silicon nitride layers within integrated circuits. More particularly, the present invention relates to a plasma etch method for forming a patterned silicon nitride layer substantially free of plasma etch bias within an integrated circuit.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by insulator layers.

It is common within the method for forming integrated circuits within and upon semiconductor substrates to employ patterned silicon nitride layers at several locations within those integrated circuits when forming those integrated circuits. In particular, patterned silicon nitride layers are most typically employed within integrated circuits as thermal oxidation masking layers within a local oxidation of silicon (LOCOS) thermal oxidation method through which portions of a silicon semiconductor substrate are thermally oxidized to form field oxide (FOX) isolation regions within and upon the silicon semiconductor substrate. To a lesser extent, patterned silicon nitride layers are also known in the art of integrated circuit fabrication to be employed as dielectric layers and adhesion promoter layers separating patterned conductor layers within integrated circuits.

While the use of patterned silicon nitride layers within integrated circuits has become common in the art of integrated circuit fabrication, the use of patterned silicon nitride layers within advanced integrated circuits of linewidth and pitch dimensions less than about 0.5 microns is not entirely without problems. In particular, there exist several problems when forming through plasma etch methods patterned silicon nitride layers of linewidth and pitch dimensions less than about 0.5 microns when those patterned silicon nitride layers are employed in forming thermal oxidation masking layers within a local oxidation of silicon (LOCOS) method through which portions of a silicon semiconductor substrate are oxidized to form field oxide (FOX) isolation regions within and upon the silicon semiconductor substrate. The problems include, but are not limited to: (1) the presence of a plasma etch bias of the patterned silicon nitride layer with respect to a patterned photoresist layer which is employed as an etch mask layer in forming the patterned silicon nitride layer from a blanket silicon nitride layer through the plasma etch method; (2) the presence of undesirable etching into a pad oxide layer and undesirable damage to a semiconductor substrate formed beneath the patterned silicon nitride layer when a blanket silicon nitride layer is over-etched through the plasma etch method employed in forming the patterned silicon nitride layer; and (3) the presence of pattern dimension non-uniformity for patterned silicon nitride layers formed upon larger diameter semiconductor substrates. It is towards providing a plasma etch method for forming upon semiconductor substrates for use within integrated circuits patterned silicon nitride layers of linewidth and pitch less than about 0.5 microns absent problems of the foregoing type that the present invention is generally directed.

Plasma etch methods and etchant gas compositions through which blanket silicon nitride layers may be etched to form patterned silicon nitride layers are known in the art of integrated circuit fabrication. For example, Wolf et al., *Silicon Processing for the VLSI Era,* Vol. 1: Process Technology, Lattice Press (Sunset Beach, Calif.; 1986), pg. 581, discloses, in general, several etchant gas compositions which may be employed within plasma etch methods through which patterned silicon nitride layers may be formed within integrated circuits. In addition, Clark, in U.S. Pat. No. 4,180,432 discloses plasma etch etchant gas compositions comprising comparatively low concentrations (ie: about 5–15 volume percent) of carbon tetrafluoride in oxygen, which plasma etch etchant gas compositions exhibit within integrated circuits favorable etch rates for silicon oxide layers with respect to both silicon nitride layers and silicon substrates. Finally, Jacob, in U.S. Pat. No. Re. 30,505 discloses etchant gas compositions preferably consisting essentially of binary mixtures of oxygen and halocarbons of no greater than two carbon atoms, where at least one of the carbon atoms within the halocarbon is linked to a predominance of fluorine atoms and where the halocarbons are preferably present at comparatively high concentrations (ie: about 75–99 volume percent) within the binary mixtures. The method provides for efficient plasma etch bias free plasma etching of various insulator and conductor layers within integrated circuits to form patterned insulator and conductor layers of linewidth and pitch dimensions as low as about of 4 microns (ie: 0.15 mils).

While the teachings of Jacob bear some relevance to the problems towards which the method of the present invention is directed, Jacob neither discloses: (1) patterned silicon nitride layers employed as masking layers within thermal oxidation masks for forming field oxide (FOX) isolation regions within and upon semiconductor substrates through local oxidation of silicon (LOCOS) methods within integrated circuits; nor discloses (2) the particular problems associated with forming patterned silicon nitride layers substantially free of plasma etch bias at linewidth and pitch dimensions of less than about 0.5 microns. Substantially plasma etch bias free patterned silicon nitride layers of linewidth and pitch dimensions less than about 0.5 microns are desirable within advanced integrated circuits since plasma etch bias is often a significant portion of linewidth and pitch dimension of patterned layers within advanced integrated circuits. Further, such plasma etch bias is often encountered within integrated circuits under circumstances where it is not readily compensated.

Thus, it is desirable to provide within the art of integrated circuit fabrication plasma etch methods and materials through which there may be formed from blanket silicon nitride layers patterned silicon nitride layers of linewidth and pitch dimensions less than about 0.5 microns substantially free of plasma etch bias. Particularly desirable are plasma etch methods and materials which provide patterned silicon nitride layers in accord with the foregoing characteristics, where the patterned silicon nitride layers are employed within thermal oxidation mask layers for forming field oxide (FOX) isolation regions within those integrated circuits while avoiding damage to silicon oxide pad oxide layers and semiconductor substrates formed beneath the patterned silicon nitride insulator layers. It is towards these goals that the present invention is specifically directed.

SUMMARY OF THE INVENTION

A first object of the present invention is to provide a plasma etch method for forming within an integrated circuit a patterned silicon nitride layer from a blanket silicon nitride layer.

A second object of the present invention is to provide a method in accord with the first object of the present invention, where the patterned silicon nitride layer is formed with linewidth and pitch dimensions of less than about 0.5 microns substantially free of plasma etch bias.

A third object of the present invention is to provide a method in accord with the first object of the present invention, where the patterned silicon nitride layer when employed within a thermal oxidation mask for forming field oxidation (FOX) isolation regions within and upon a semiconductor substrate is formed without damaging a silicon oxide pad oxide layer or a semiconductor substrate formed beneath the patterned silicon nitride layer.

A fourth object of the present invention is to provide a method in accord with the foregoing objects of the present invention, which method is readily manufacturable.

In accord with the objects of the present invention, there is provided by the present invention a plasma etch method for forming for use within an integrated circuit a patterned silicon nitride layer from a blanket silicon nitride layer. To practice the method of the present invention, there is first provided a substrate having formed thereover a blanket silicon nitride layer. There is then formed upon the blanket silicon nitride layer a patterned photoresist layer. Finally, there is etched through a first plasma etch method while employing the patterned photoresist layer as an etch mask layer the blanket silicon nitride layer to form a patterned silicon nitride layer. The first plasma etch method employs a fir etchant gas composition comprising a perfluorocarbon etchant gas, a hydrofluorocarbon etchant gas and an oxygen etchant gas at a perfluorocarbon etchant gas flow rate, a hydrofluorocarbon etchant gas flow rate and an oxygen etchant gas flow rate which yield substantially no plasma etch bias of the patterned silicon nitride layer with respect to the patterned photoresist layer. When the patterned silicon nitride layer is employed within a thermal oxidation a mask when forming within and upon a semiconductor substrate field oxide (FOX) isolation regions through a local oxidation of silicon (LOCOS) method, the blanket silicon nitride layer is only nearly completely patterned through the first plasma etch method. The nearly completely patterned blanket silicon nitride layer is then completely patterned through a second plasma etch method, where the second plasma etch method employs a second etchant gas composition comprising a perfluorocarbon etchant gas, a hydrofluorocarbon etchant gas and an oxygen etchant gas at a perfluorocarbon etchant gas flow rate, a hydrofluorocarbon etchant gas flow rate and an oxygen etchant gas flow rate which minimizes etching of a blanket silicon oxide layer formed beneath the patterned silicon nitride layer within the thermal oxidation mask.

The present invention provides a plasma etch method for forming within an integrated circuit a patterned silicon nitride layer from a blanket silicon nitride layer, where the patterned silicon nitride layer is formed with linewidth and pitch dimensions of less than about 0.5 microns substantially free of plasma etch bias. The method of the present invention achieves these goals through employing within a first plasma etch method a novel etchant gas composition comprising a perfluorocarbon etchant gas, a hydrofluorocarbon etchant gas and an oxygen etchant gas at individual etchant gas flow rates which provide the patterned silicon nitride layer substantially free of plasma etch bias. The first plasma etch method does not discriminate with respect to the linewidth and pitch dimensions of the patterned silicon nitride layer. Thus, the first plasma etch method is applicable to patterned silicon nitride layers of linewidth and pitch dimensions of less than about 0.5 microns.

The method of the present invention may be employed where the patterned silicon nitride layer, when employed within a thermal oxidation mask for forming field oxidation (FOX) isolation regions within and upon a semiconductor substrate, is formed without damaging a silicon oxide pad oxide layer or a semiconductor substrate formed beneath the patterned silicon nitride layer. Under such circumstances, the present invention provides that the blanket silicon nitride layer is only nearly completely patterned through the first plasma etch method to yield a nearly completely patterned silicon nitride layer. The nearly completely patterned silicon nitride layer is then completely patterned through a second plasma etch method, where the second plasma etch method employs a second etchant gas composition comprising a perfluorocarbon etchant gas, a hydrofluorocarbon etchant gas and an oxygen etchant gas at a perfluorocarbon etchant gas flow rate, a hydrofluorocarbon etchant gas flow rate and an oxygen etchant gas flow rate which minimizes etching of a blanket silicon oxide layer formed beneath the patterned silicon nitride layer within the thermal oxidation mask. For similar reasons, damage is also avoided to a semiconductor substrate upon which is formed the blanket silicon oxide layer.

The method of the present invention is readily manufacturable. The method of the present invention employs novel etchant gas compositions within a first plasma etch method and a second plasma etch method, where plasma etch methods are otherwise generally known in the art of integrated circuit fabrication. Thus, in the sense that the method of the present invention requires no unique hardware to practice the method of the present invention, the method of the present invention is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a plasma etch method for forming for use within an integrated circuit a patterned silicon nitride layer from a blanket silicon nitride layer, where the patterned silicon nitride layer may have linewidth and pitch dimensions of less than about 0.5 microns while simultaneously being formed with substantially no plasma etch bias. The method of the present invention achieves this goal by employing within a first plasma etch method when forming the patterned silicon nitride layer from a blanket silicon nitride layer a first etchant gas composition comprising a perfluorocarbon etchant gas, a hydrofluorocarbon etchant gas and an oxygen etchant gas at a perfluorocarbon etchant gas flow rate, a hydrofluorocarbon etchant gas flow rate and an oxygen etchant gas flow rate which provides a patterned silicon nitride layer with substantially no plasma etch bias. Within the context of the method of the present invention, for patterned silicon nitride layers of linewidth and pitch dimensions less than about 0.5 microns, substantially no plasma etch bias corresponds to a plasma etch bias within the tolerance typically encountered in defining patterned silicon nitride layers of linewidth and pitch dimension less than about 0.5 microns. Typically this tolerance will be in the range of about 0.05 to about 0.1 microns.

While the preferred embodiment of the method of the present invention employs the method of the present invention for forming a patterned silicon nitride layer for use within a thermal oxidation mask for forming field oxide (FOX) isolation regions within and upon a semiconductor substrate through a local oxidation of silicon (LOCOS) method, the method of the present invention may also be employed in forming within integrated circuits other patterned silicon nitride layers of linewidth and pitch dimension less than about 0.5 microns substantially free of plasma etch bias, where the patterned silicon nitride layers are formed at other locations within the integrated circuit. Typically, such other patterned silicon nitride insulator layers will be employed as dielectric layers or adhesion promoter layers within the integrated circuit. Thus, for a general application of the method of the present invention, the blanket silicon nitride layers from which are formed patterned silicon nitride layers will typically have a thickness of from about 1000 to about 2000 angstroms.

Figure 1:
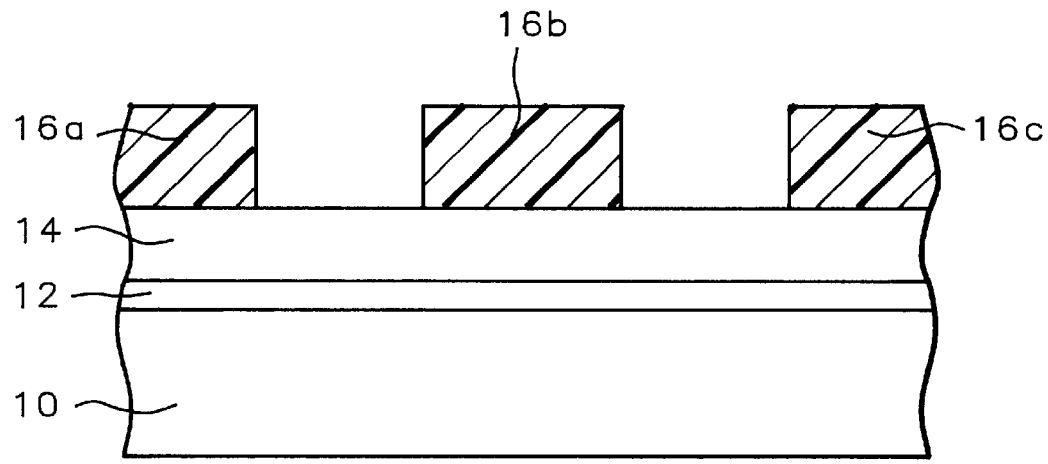
FIG. 1 to FIG. 5 show a series of schematic cross-sectional diagrams illustrating the results of progressive stages in forming upon a semiconductor substrate a patterned silicon nitride layer which is employed in forming a thermal oxidation mask through which is formed field oxide (FOX) isolation regions within and upon the semiconductor substrate through a local oxidation of silicon (LOCOS) method.

Referring now to FIG. 1 to FIG. 5, there is shown a series of schematic cross-sectional diagrams illustrating the results of progressive stages in forming upon a semiconductor substrate a series of field oxide (FOX) silicon oxide isolation regions through a local oxidation of silicon (LOCOS) method employing a thermal oxidation mask having formed therein a patterned silicon nitride layer through a plasma etch method in accord with the preferred embodiment of the method of the present invention. Shown in FIG. 1 is a schematic cross-sectional diagram of the semiconductor substrate at the early stages in forming the field oxide (FOX) isolation regions.

Shown in FIG. 1 is a semiconductor substrate 10 having formed thereupon a blanket silicon oxide pad oxide layer 12. Although it is known in the art that semiconductor substrates may be formed with either dopant polarity, various dopant concentrations and several crystallographic orientations, for the preferred embodiment of the method of the present invention, the semiconductor substrate 10 is preferably a (100) silicon semiconductor substrate having an N- or P- doping. Similarly, although it is also known in the art that blanket silicon oxide pad oxide layers may be formed upon silicon semiconductor substrates through methods including but not limited to blanket silicon oxide pad oxide layer growth methods and blanket silicon oxide pad oxide layer deposition methods, for the preferred embodiment of the method of the present invention, the blanket silicon oxide pad oxide layer 12 is preferably formed upon the semiconductor substrate 10 through a blanket silicon oxide pad oxide thermal growth method at a temperature of from about 900 to about 980 degrees centigrade to form a blanket silicon oxide pad oxide layer 12 of thickness about 200 to about 350 angstroms.

There is also shown in FIG. 1 the presence of (1) a blanket silicon nitride layer 14 formed upon the blanket silicon oxide pad oxide layer 12; and (2) a series of patterned photoresist layers 16a, 16b and 16c formed upon the blanket silicon nitride layer 14. The blanket silicon nitride layer 14 may be formed through any of several blanket silicon nitride layer formation methods as are known in the art, including but not limited to chemical vapor deposition (CVD) methods, plasma enhanced chemical vapor deposition (PECVD) methods and physical vapor deposition (PVD) sputtering methods. For the preferred embodiment of the method of the present invention, the blanket silicon nitride layer 14 is preferably formed through a chemical vapor deposition (CVD) method, as is most common in the art of forming blanket silicon nitride layers within integrated circuits. Preferably, the blanket silicon nitride layer 14 so formed is from about 1000 to about 2000 angstroms thick. Similarly, although the series of patterned photoresist layers 16a, 16b and 16c may be formed form any of several photoresist materials as are known in the art, including photoresist materials chosen from the general group of photoresist materials including negative photoresist materials and positive photoresist materials, for the preferred embodiment of the method of the present invention, the patterned photoresist layers 16a, 16b and 16c are preferably formed of a positive photoresist material, in order to provide patterned photoresist layers 16a, 16b and 16c of optimal dimensional stability. Preferably the patterned photoresist layers 16a, 16b and 16c so formed are from about 6000 to about 11000 angstroms thick each. Preferably the patterned photoresist layers 16a, 16b and 16c each have linewidth dimensions of about 0.25 to about 0.5 microns and define pitch dimensions of from about 0.5 to about 1.0 microns.

Figure 2:
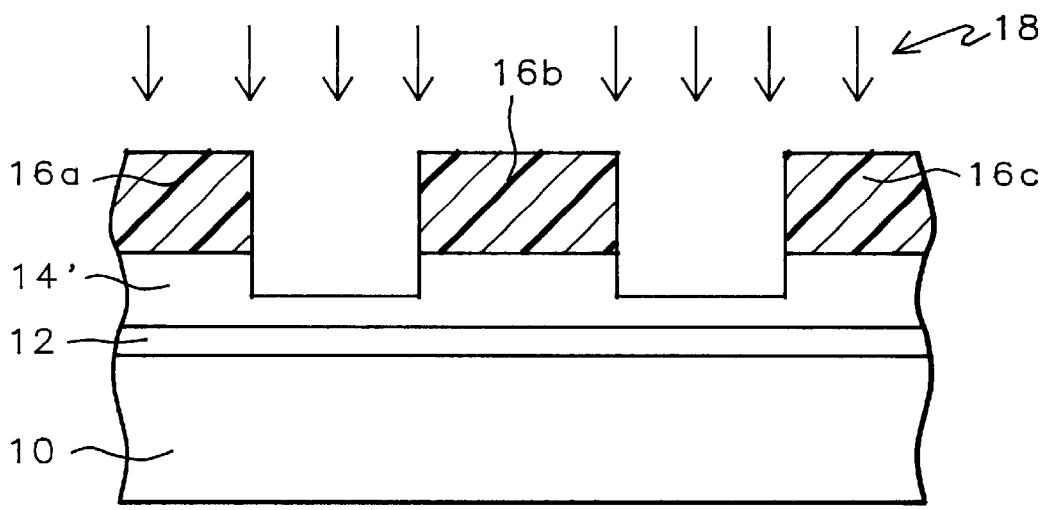

Referring now to FIG. 2, there is shown a schematic cross-sectional diagram illustrating the results of further processing of the integrated circuit whose schematic cross-sectional diagram is illustrated in FIG. 1. Shown in FIG. 2 is the presence of a first plasma 18 employed within a first plasma etch method through which the blanket silicon nitride layer 14 is nearly completely patterned to form the nearly completely patterned silicon nitride layer 14'. Within the preferred embodiment of the method of the present invention, the blanket silicon nitride layer 14 is only nearly completely patterned to form the nearly completely patterned silicon nitride layer 14 in order to avoid undesirable over-etching into the blanket silicon oxide pad oxide layer 12 and consequent plasma etch damage to the semiconductor substrate 10. Within a general embodiment of the method of the present invention, a blanket silicon nitride layer formed in a location other than the blanket silicon nitride layer 14 may be completely etched through a plasma etch method equivalent to the first plasma etch method provided that there exists no concern regarding plasma etch damage to an integrated circuit layer formed beneath the blanket silicon nitride layer formed in the location other than the blanket silicon nitride layer 14.

In order to impart the desirable substantially plasma etch bias free characteristic to the nearly completely patterned silicon nitride layer 14', it has been found experimentally that the first plasma 18 employed within the first plasma etch method preferably employs a first plasma etch etchant gas composition comprising a perfluorocarbon etchant gas, a hydrofluorocarbon etchant gas and an oxygen etchant gas, where the perfluorocarbon etchant gas flow rate, the hydrofluorocarbon etchant gas flow rate and the oxygen etchant gas flow rate are chosen such that the nearly completely patterned silicon nitride layer 14' is formed with substantially no plasma etch bias with respect to the patterned photoresist layers 16a, 16b and 16c. Further, it has also been found experimentally that the method of the present invention will not work optimally well with only either the perfluorocarbon etchant gas or the hydrofluorocarbon etchant gas in conjunction with the oxygen etchant gas. Presumably, the presence of both the perfluorocarbon etchant gas and the hydrofluorocarbon etchant gas with the oxygen etchant gas allows for optimization of fluorine content, hydrogen content and oxygen content within the first plasma 18 not achievable with binary etchant gas compositions.

Although perfluorocarbon etchant gases and hydrofluorocarbon etchant gases are known in the art to contain at least up to three carbon atoms, and such hydrofluorocarbon etchant gases are known in the art to contain a plurality of hydrogen atoms, for the preferred embodiment of the method of the present invention, the perfluorocarbon etchant gas is preferably carbon tetrafluoride and the hydrofluorocarbon etchant gas is preferably trifluoromethane, although other perfluorocarbon etchant gases and hydrofluorocarbon etchant gases may be employed. For the first plasma 18 employed within the first plasma etch method, the carbon tetrafluoride perfluorocarbon etchant as is preferably employed at a perfluorocarbon etchant gas flow rate of from about 10 to about 50 standard cubic centimeters per minute (sccm). More preferably, the carbon tetrafluoride perfluorocarbon etchant gas is also employed at a flow rate of from about 10 to about 50 standard cubic centimeters per minute (sccm). Most preferably, the carbon tetrafluoride perfluorocarbon etchant gas is employed at a flow rate of about 30 standard cubic centimeters per minute (sccm). For the first plasma 18 employed within the first plasma etch method, the trifluoromethane hydrofluorocarbon etchant gas is preferably employed at a flow rate of from about 10 to about 50 standard cubic centimeters per minute (sccm). More preferably, the trifluoromethane hydrofluorocarbon etchant gas is employed at a flow rate of from about 20 to about 30 standard cubic centimeters per minute (sccm). Most preferably, the trifluoromethane hydrofluorocarbon etchant gas is employed at a flow rate of about 25 standard cubic centimeters per minute (sccm). For the first plasma 18 employed within the first plasma etch method, the oxygen etchant gas is preferably employed at a flow rate of from about 1 to about 30 standard cubic centimeters per minute (sccm). More preferably, the oxygen etchant gas is employed at a flow rate of from about 6 to about 15 standard cubic centimeters per minute (sccm). Most preferably, the oxygen etchant gas is employed at a flow rate of about 8 standard cubic centimeters per minute (sccm).

Other conditions under which the first plasma 18 within the first plasma etch method is employed include: (1) a reactor chamber pressure of from about 300 to about 450 mtorr; (2) a radio frequency power of from about 400 to about 600 watts at a radio frequency of 13.56 MHZ; (3) a plasma gap of from about 0.8 to about 1.3 centimeters; (4) an argon background gas flow rate of from about 300 to about 1000 standard cubic centimeters per minute (sccm); (5) a backside helium cooling pressure of from about 6 to about 16 torr to provide a substrate electrode temperature of from about zero to about 30 degrees centigrade (more preferably from about 10 to about 20 degrees centigrade); and (6) a pre first plasma etch baking of the a conductor substrate 10 at a temperature of from about 90 to about 120 degrees centigrade for a time period of from about 45 to about 60 minutes. Preferably, the first plasma 18 within the first plasma etch method is employed in forming the nearly completely patterned silicon nitride layer 14' through an endpoint detection method as is common in the art. The endpoint detection method may employ detection methods including but not limited to optical detection methods and residual gas analysis (RGA) detection methods. Typically, the endpoint detection will provide a nearly completely patterned silicon nitride layer 14' of about 90 to about 98 percent complete patterning from the blanket silicon nitride layer 14.

While the mechanism by which the first etchant gas composition employed within the first plasma 18 provides a nearly completely patterned silicon nitride layer 14' which exhibits substantially no plasma etch bias with respect to the patterned photoresist layers 16a, 16b and 16c is not entirely clear, it is believed that within the preferred embodiment of the method of the present invention the concentration of oxygen etchant gas is: (1) maintained sufficiently high such that the blanket silicon nitride layer 14 is efficiently etched; and (2) maintained sufficiently low such that the patterned photoresist layers 16a, 16b and 16c are not oxidized and partially stripped by the oxygen etchant gas within the first plasma etchant gas composition. Similarly, it is believed that the trifluoromethane etchant gas assists in providing a sidewall passivation polymer upon the exposed sidewalls of the nearly completely patterned silicon nitride layer 14' as the nearly completely patterned silicon nitride layer 14' is formed. Finally, it is also believed that by maintaining the substrate electrode temperature within a narrow range, preferably with a narrow tolerance, the uniformity of the linewidth and pitch dimensions of the nearly completely patterned silicon nitride layer 14' is substantially increased.

Figure 3:
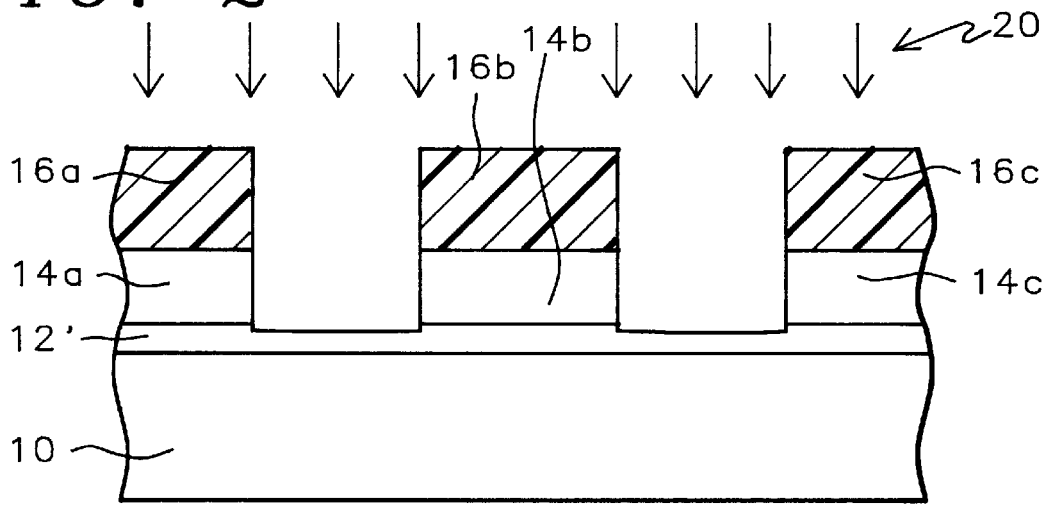

Referring now to FIG. 3 there is shown a schematic cross-sectional diagram illustrating the results of further processing of the integrated circuit whose schematic cross-sectional diagram is illustrated in FIG. 2. Shown in FIG. 3 is the results of completely patterning and over-etching through a second plasma etch method employing a second plasma 20 the nearly completely patterned silicon nitride layer 14' to form a series of patterned silicon nitride layers 14a, 14b and 14c while simultaneously slightly etching the blanket silicon oxide pad oxide layer 12 to form the slightly etched blanket silicon oxide pad oxide layer 12'. Similarly to reasons discussed with respect to the first plasma 18, the second plasma 20 is also preferably comprised of: (1) a perfluorocarbon etchant gas which is preferably a carbon tetrafluoride perfluorocarbon etchant gas; (2) a hydrofluorocarbon etchant gas which is preferably a trifluoromethane hydrofluorocarbon etchant gas; and (3) an oxygen etchant gas. Alternative perfluorocarbon etchant gases and hydrofluorocarbon etchant gases may, however, be employed within the second plasma 20 within the second plasma etch method of the preferred embodiment of the method of the present invention. In contrast with the first plasma 18, the perfluorocarbon etchant gas, the hydrofluorocarbon etchant gas and the oxygen etchant gas are present within the second plasma 20 at individual flow rates which limit etching of the blanket silicon oxide pad oxide layer 12 when forming the slightly etched blanket silicon oxide pad oxide layer 12'.

Thus, for the preferred embodiment of the method of the present invention, the second plasma 20 preferably employs the carbon tetrafluoride perfluorocarbon etchant gas at a flow rate of from about 10 to about 50 standard cubic centimeters per minute (sccm). More preferably, the carbon tetrafluoride perfluorocarbon etchant gas is also employed at a flow rate of from about 10 to about 50 standard cubic centimeters per minute (scan). Most preferably, the carbon tetrafluoride perfluorocarbon etchant gas is employed at a flow rate of about 30 standard cubic centimeters per minute (sccm). Similarly, for the preferred embodiment of the method of the present invention, the second plasma 20 preferably employs the trifluoromethane hydrofluorocarbon etchant gas at a flow rate of from about 10 to about 50 standard cubic centimeters per minute (sccm). More preferably, the trifluoromethane hydrofluorocarbon etchant gas is employed at a flow rate of from about 15 to about 25 standard cubic centimeters per minute (sccm). Most preferably, the trifluoromethane hydrofluorocarbon etchant gas is employed at a flow rate of about 20 standard cubic centimeters per minute (sccm). Finally, for the preferred embodiment of the method of the present invention, the second plasma 20 preferably employs the oxygen etchant gas at a flow rate of from about 1 to about 100 standard cubic centimeters per minute (sccm). More preferably, the oxygen etchant gas is employed at a flow rate of from about 30 to about 70 standard cubic centimeters per minute (sccm). Most preferably, the oxygen etchant gas is employed at a flow rate of about 40 to about 60 standard cubic centimeters per minute (sccm). Ideally, the oxygen etchant gas is employed at a flow rate of about 50 standard cubic centimeters per minute (sccm).

Other conditions under which the second plasma 20 within the second plasma etch method is employed include: (1) a reactor chamber pressure of from about 300 to about 450 mtorr; (2) a radio frequency power of from about 400 to about 600 watts at a radio frequency of 13.56 MHZ; (3) a plasma gap of from about 0.8 to about 1.3 centimeters; (4) an argon background gas flow rate of from about 100 to about 500 standard cubic centimeters per minute (sccm); and (5) a backside helium cooling pressure of from about 6 to about 16 torr which yields a substrate electrode temperature of from about zero to about 30 degrees centigrade (more preferably about 10 to about 20 degrees centigrade). Preferably, the second plasma etch method 20 is provided for a timed over-etch period of from about 5 to about 20 seconds.

While the mechanism through which the second plasma 20 within the second plasma etch method operates to limit etching of the blanket silicon oxide pad oxide layer 12 in forming the slightly etched blanket silicon oxide pad oxide layer 12' is not entirely well understood, it is believed that the increase in oxygen concentration within the second plasma 20 through the increased oxygen etchant gas flow rate and the decreased argon background gas flow rate provides a sufficiently oxidizing atmosphere to inhibit rapid etching of the blanket silicon oxide pad oxide layer 12 when forming the slightly etched blanket silicon oxide pad oxide layer 12' through the second plasma etch method. Similarly, it is also believed that the simultaneous presence of the trifluoromethane hydrofluorocarbon etchant gas continues to provide sidewall passivation to the patterned silicon nitride layers 14a, 14b and 14c, thus maintaining within the second plasma etch method the substantially zero plasma etch bias of the patterned silicon nitride layers 14a, 14b and 14c with respect to the patterned photoresist layers 16a, 16b and 16c, even under circumstances where the patterned photoresist layers 16a, 16b and 16c are etched somewhat due to the increased oxygen etchant gas concentration within the second plasma 20. Further, it is also believed that by continuing to maintain the substrate electrode temperature within a narrow range the uniformity of the patterned silicon nitride layers 14a, 14b and 14c is maintained.

Figure 4:
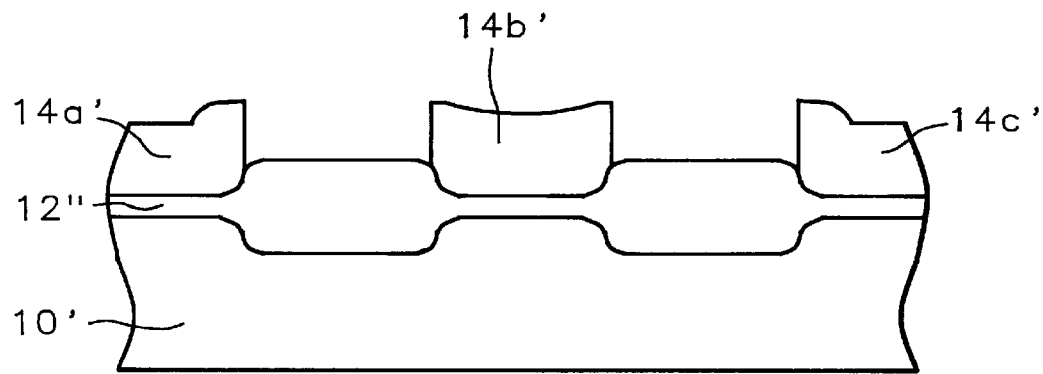

Referring now to FIG. 4, there is shown a schematic cross-sectional diagram illustrating the results of further processing of the semiconductor substrate whose schematic cross-sectional diagram is illustrated in FIG. 3 .Shown in FIG. 4 is a schematic cross-sectional diagram of the semiconductor substrate 10 whose schematic cross-sectional diagram is illustrated in FIG. 3, but from whose surface has first been removed the patterned photoresist layers 16a, 16b and 16c. The patterned photoresist layers 16a, 16b and 16c may be removed through methods as are conventional in the art, which will typically include, but are not limited to, wet chemical stripping methods and dry plasma oxygen stripping methods.

Once having removed the patterned photoresist layers 16a, 16b and 16c from the semiconductor substrate 10 whose schematic cross-sectional diagram is illustrated in FIG. 3, the semiconductor substrate 10 is then thermally oxidized to form the thermally oxidized slightly etched blanket silicon oxide pad oxide layer 12" within and upon the thermally oxidized semiconductor substrate 10' beneath the thermally oxidized patterned silicon nitride layers 14a', 14b' and 14c'. In the thermal oxidation method, portions of the semiconductor substrate 10 are consumed in forming the thermally oxidized semiconductor substrate 10', the portions being primarily at locations of the thermally oxidized semiconductor substrate 10' which are uncovered by the thermally oxidized patterned silicon nitride layers 14a', 14b' and 14c'. The consumption of portions of the semiconductor substrate 10 at those locations leads to the thicker portions of the thermally oxidized slightly etched blanket silicon oxide pad oxide layer 12" in those locations, and also to the curvature of the thermally oxidized patterned silicon nitride layers 14a', 14b' and 14c'. Typically and preferably, the semiconductor substrate 10 is thermally oxidized at a temperature of from about 900 to about 980 degrees centigrade for a time period of from about 20 to about 40 minutes to yield the thermally oxidized semiconductor substrate 10', the thermal oxidized slightly etched blanket silicon oxide pad oxide layer 12" and the thermally oxidized patterned silicon nitride layers 14a', 14b' and 14c' as illustrated within the schematic cross-sectional diagram of FIG. 4.

Figure 5:
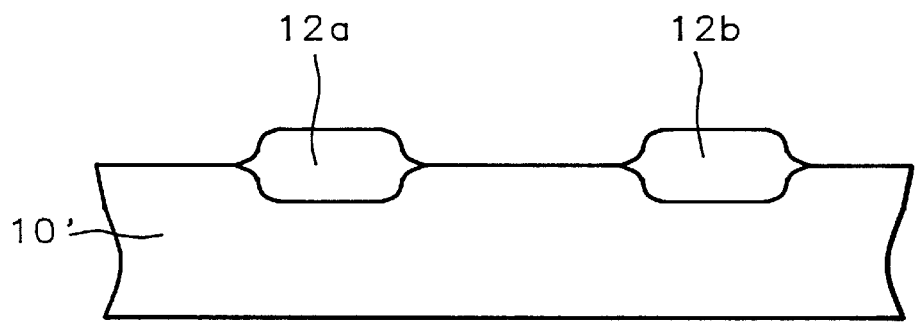

Referring now to FIG. 5, there is shown a schematic cross-sectional diagram illustrating the results of further processing of the thermally oxidized semiconductor substrate 10' whose schematic cross-sectional diagram is illustrated in FIG. 4. Shown in FIG. 5 is a schematic cross-sectional diagram corresponding to the schematic cross-sectional diagram of FIG. 4 but from whose surface has been: (1) completely stripped the thermally oxidized patterned silicon nitride layers 14a', 14b' and 14c'; and (2) partially stripped the thermally oxidized slightly etched blanket silicon oxide pad oxide layer 12" to yield the field oxide (FOX) isolation regions 12a and 12b formed within and upon the thermally oxidized semiconductor substrate 10'. The thermally oxidized patterned silicon nitride layers 14a', 14b' and 14c' may be completely stripped and the thermally oxidized slightly etched blanket silicon oxide pad oxide layer 12" may be partially stripped through methods as are conventional in the art. Typically, although not exclusively, the thermally oxidized patterned silicon nitride layers 14a', 14b' and 14c' are completely stripped through immersion of the thermally oxidized semiconductor substrate 10' into refluxing phosphoric acid. Typically, although not exclusively, the thermally oxidized slightly etched blanket silicon oxide pad oxide layer 12" is partially stripped through immersion of the thermally oxidized semiconductor substrate 10' in a buffered oxide etchant (BOE) solution and/or a dilute hydrofluoric acid solution.

Upon partially stripping the thermally oxidized slightly etched blanket silicon oxide pad oxide layer 12", there is formed a thermally oxidized semiconductor substrate 10' having formed therein a pair of field oxide (FOX) isolation regions 12a and 12b which are formed through the preferred embodiment of the method of the present invention which includes a local oxidation of silicon (LOCOS) thermal oxidation method. The field oxide (FOX) isolation regions 12a and 12b so formed are formed uniformly since the patterned silicon nitride layers employed as thermal oxidation mask layers when forming the field oxide (FOX) isolation regions 12a and 12b are formed uniformly, with substantially zero plasma etch bias, with limited etching of a blanket silicon oxide pad oxide layer and without damaging the semiconductor substrate within and upon which are formed those field oxide (FOX) isolation regions.

EXAMPLE

Upon an eight inch (100) silicon semiconductor substrate was formed a blanket silicon oxide pad oxide layer through thermal oxidation of the semiconductor substrate at a temperature of about 950 degrees centigrade to form a blanket silicon oxide pad oxide of thickness about 250 angstroms. Upon the blanket silicon oxide pad oxide layer so formed was then formed a blanket silicon nitride layer of thickness about 1500 angstroms through a chemical vapor deposition (CVD) method employing silane as a silicon source material and ammonia as a nitrogen source material. Formed then upon the blanket silicon nitride layer was a series of patterned photoresist layers formed from a novolak positive photoresist material. The patterned photoresist layers had a thickness of about 11000 angstroms, a linewidth of about 0.5 microns and a pitch of about 1.0 microns.

The blanket silicon nitride layer was then etched while employing the patterned photoresist layers as an etch mask layer through a two step plasma etch method in accord with the preferred embodiment of the method of the present invention. The first plasma etch step within the two step plasma etch method employed: (1) a reactor chamber pressure of about 360 mtorr; (2) a radio frequency power of about 450 watts at a radio frequency of 13.56 MHZ; (3) a plasma gap of about 1.05 centimeters; (4) a carbon tetrafluoride perfluorocarbon etchant gas at a flow rate of about 30 standard cubic centimeters per minute (sccm); (4) a trifluoromethane hydrofluorocarbon etchant gas at a flow rate of about 25 standard cubic centimeters per minute (sccm); (5) an oxygen etchant gas at a flow rate of about 8 standard cubic centimeters per minute (sccm); (6) an argon background gas at a flow rate of about 800 standard cubic centimeters per minute (sccm); (7) a backside helium cooling pressure of about 7.5 torr which provided a substrate electrode temperature of about 15 degrees centigrade; and (8) a pre first plasma etch step baking of the semiconductor substrate at a temperature of about 90 degrees centigrade for a time period of about 60 minutes. The first plasma etch step was undertaken until there was reached an endpoint detected by an optical method as is conventional in the art to yield a nearly completely patterned silicon nitride layer.

The remaining nearly completely patterned silicon nitride layer was then completely patterned and over-etched through a second plasma etch step which was undertaken at conditions other equivalent to the conditions employed within the first plasma etch step, with the following exceptions: (1) the radio frequency power was employed at about 525 watts at a radio frequency of 13.56 MHZ; (2) the trifluoromethane hydrofluorocarbon etchant gas was employed at a flow rate of about 20 standard cubic centimeters per minute (sccm); and (3) the oxygen etchant gas was employed at a flow rate of about 50 standard cubic centimeters per minute (sccm). The second plasma etch step was undertaken for a time period of about 13 seconds to yield a series of patterned silicon nitride layers and a slightly etched blanket silicon oxide pad oxide layer.

There was then measured the uniformity, the sidewall profile and the plasma etch bias of the series of patterned silicon nitride layers, as well as the thickness loss of the slightly etched blanket silicon oxide pad oxide layer at areas exposed through the patterned silicon nitride layers. In addition, the etch rate of the first plasma etch step and the second plasma etch step was also calculated. Results of the calculation and measurements included: (1) a silicon nitride etch rate of about 2000 angstroms per minute; (2) a pattern uniformity of the patterned silicon nitride layers across the eight inch semiconductor substrate of about 5 percent; (3) a sidewall profile of the patterned silicon nitride layers of greater than about 75 degrees; (4) a plasma etch bias of the patterned silicon nitride layers of less than about 0.05 microns; (5) a blanket silicon oxide pad oxide layer thickness loss of less than about 350 angstroms; and (6) no observable attack upon the eight inch semiconductor substrate.

Thus, through a method in accord with the preferred embodiment of the method of the present invention there may be formed over a semiconductor substrate a patterned silicon nitride layer which may be employed within a thermal oxidation mask formed upon the semiconductor substrate, where the patterned silicon nitride layer exhibits excellent pattern uniformity, sidewall profile and plasma etch bias. Simultaneously with forming the patterned silicon nitride layer for use within the thermal oxidation mask, there is also avoided etching loss of a blanket silicon oxide pad oxide layer formed beneath the patterned silicon nitride layer and plasma etch damage to a semiconductor substrate upon which is formed the blanket silicon oxide pad oxide layer.

As is understood by a person skilled in the art, the preferred embodiment and example of the method of the present invention are illustrative of the method of the present invention rather than limiting of the method of the present invention. Revisions and modifications may be made to materials, structures and dimensions through which is provided the preferred embodiment and example of the method of the present invention while still providing an embodiment or example within the spirit and scope of the method of the present invention, as defined by the appended claims.

What is claimed is:

1. A plasma etch method for forming a patterned silicon nitride layer upon a blanket silicon oxide layer within an integrated circuit comprising:

providing a substrate;

forming over the substrate a blanket silicon oxide layer;

forming upon the blanket silicon oxide layer a blanket silicon nitride layer;

forming upon the blanket silicon nitride layer a pattered photoresist layer;

etching the blanket silicon nitride layer through use of a first plasma etch method while employing the patterned photoresist layer as an etch mask layer to form a nearly completely etched patterned silicon nitride layer, the first plasma etch method comprising a first etchant gas composition comprising a perfluorocarbon etchant gas, a hydrofluorocarbon etchant gas and an oxygen etchant gas at a perfluorocarbon etchant gas flow rate, a hydrofluorocarbon etchant gas flow rate and an oxygen etchant gas flow rate which yields substantially no plasma etch bias of the nearly completely etched patterned silicon nitride layer with respect to the pattered photoresist layer; and completely etching the nearly completely etched patterned silicon nitride layer through use of a second plasma etch method while employing the patterned photoresist layer as an etch mask layer to form a completely etched patterned silicon nitride layer, the second plasma etch method comprising a second etching gas composition comprising a perfluorocarbon etchant gas, a hydrofluorocarbon etchant gas and an oxygen etchant gas at a perfluorocarbon etchant gas flow rate, a hydrofluorocarbon etchant gas flow rate and an oxygen etchant gas flow rate which minimizes etching of the blanket silicon oxide layer, where the second etchant gas composition is not equivalent to the first etchant gas composition.

2. The method of claim 1 wherein the blanket silicon oxide layer is from about 200 to about 350 angstroms thick.

3. The method of claim 1 wherein the blanket silicon nitride layer is from about 1000 to about 2000 angstroms thick.

4. The method of claim 1 wherein the patterned photoresist layer has linewidth and pitch dimensions of less than about 0.5 microns.

5. The method of claim 1 wherein the perfluorocarbon gas is carbon tetrafluoride and the hydrofluorocarbon gas is trifluoromethane.

6. The method of claim 1 wherein a second oxygen etchant gas volume concentration within the second etchant gas composition is eater than a first oxygen etchant gas volume concentration within the first etchant gas composition.

7. The method of claim 5 wherein:

within the first plasma etch method the carbon tetrafluoride perfluorocarbon etchant gas flow rate is from about 10 to about 50 standard cubic centimeters per minute (sccm), the trifluoromethane hydrofluorocarbon etchant gas flow rate is from about 10 to about 50 standard cubic centimeters per minute (sccm) and the oxygen etchant gas flow rate is from about 1 to about 30 standard cubic centimeters per minute (sccm); and within the second plasma etch method the carbon tetrafluoride perfluorocarbon etchant gas flow rate is from about 10 to about 50 standard cubic centimeters per minute (sccm), the trifluoromethane hydrofluorocarbon etchant gas flow rate is from about 10 to about 50 standard cubic centimeters per minute (sccm) and the oxygen etchant gas flow rate is from about 30 to about 70 standard cubic centimeters per minute (sccm).

8. The method of claim 7 further comprising a background gas within the first etchant gas composition, the background gas being present at a flow rate of about 800 standard cubic centimeters per minute.

9. The method of claim 5 wherein:

within the first plasma etch method the carbon tetrafluoride perfluorocarbon etchant gas flow rate is from about 10 to about 50 standard cubic centimeters per minute (sccm), the trifluoromethane hydrofluorocarbon etchant gas flow rate is from about 20 to about 30 standard cubic centimeters per minute (sccm) and the oxygen etchant gas flow rate is from about 6 to about 15 standard cubic centimeters per minute (sccm); and within the second plasma etch method the carbon tetrafluoride perfluorocarbon etchant gas flow rate is from about 10 to about 50 standard cubic centimeters per minute (sccm), the trifluoromethane hydrofluorocarbon etchant gas flow rate is from about 15 to about 25 standard cubic centimeters per minute (sccm) and the oxygen etchant gas flow rate is from about 40 to about 60 standard cubic centimeters per minute (sccm).

10. The method of claim 9 further comprising a background gas within the first etchant gas composition, the background gas being present at a flow rate of about 800 standard cubic centimeters per minute.

* * * * *